(12) United States Patent
Hu et al.

(10) Patent No.: US 10,546,796 B2
(45) Date of Patent: Jan. 28, 2020

(54) BACKPLANE STRUCTURE AND PROCESS FOR MICRODRIVER AND MICRO LED

(71) Applicant: Apple Inc., Cupertino, CA (US)

(72) Inventors: Hsin-Hua Hu, Los Altos, CA (US); Jaein Choi, San Jose, CA (US); James E. Pedder, Cupertino, CA (US); Ion Bita, Santa Clara, CA (US); Hairong Tang, San Jose, CA (US); Chin Wei Hsu, Hsinchu (TW); Sandeep Chalasani, San Jose, CA (US); Chih-Lei Chen, Taichung (TW); Sunggu Kang, San Jose, CA (US); Shinya Ono, Cupertino, CA (US); Jung Yen Huang, Zhubei (TW); Lun Tsai, Zhubei (TW)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/077,185

(22) PCT Filed: Feb. 10, 2017

(86) PCT No.: PCT/US2017/017532
§ 371 (c)(1),
(2) Date: Aug. 10, 2018

(87) PCT Pub. No.: WO2017/142817
PCT Pub. Date: Aug. 24, 2017

(65) Prior Publication Data
US 2019/0115274 A1    Apr. 18, 2019

Related U.S. Application Data

(60) Provisional application No. 62/297,113, filed on Feb. 18, 2016.

(51) Int. Cl.
H01L 23/48 (2006.01)
H01L 23/31 (2006.01)
(Continued)

(52) U.S. Cl.
CPC .......... *H01L 23/3192* (2013.01); *H01L 24/13* (2013.01); *H01L 24/16* (2013.01);
(Continued)

(58) Field of Classification Search
CPC ... H01L 25/167; H01L 25/0753; H01L 24/13; H01L 24/16
(Continued)

(56) References Cited

U.S. PATENT DOCUMENTS 6,528,857 B1 * 3/2003 Glenn ............... H01L 27/14618
257/432
6,870,190 B2    3/2005 Okuyama et al.
(Continued)

FOREIGN PATENT DOCUMENTS

CN    105244347 A    1/2016
JP    2003100811 A1    4/2003
(Continued)

OTHER PUBLICATIONS

PCT International Search Report and Written Opinion for International Application No. PCT/US2017/017532, dated Jun. 22, 2017, 22 pages.
(Continued)

*Primary Examiner* — Nitin Parekh
(74) *Attorney, Agent, or Firm* — Jaffery Watson Mendonsa & Hamilton LLP

(57) ABSTRACT

Micro LED and microdriver chip integration schemes are described. In an embodiment a microdriver chip includes a plurality of trenches formed in a bottom surface of the microdriver chip, with each trench surrounding a conductive
(Continued)

stud extending below a bottom surface of the microdriver chip body. Integration schemes are additionally described for providing electrical connection to conductive terminal contacts and micro LEDs bonded to a display substrate and adjacent to a microdriver chip.

20 Claims, 13 Drawing Sheets

(51) Int. Cl.
  *H01L 23/00* (2006.01)
  *H01L 25/075* (2006.01)
  *H01L 25/16* (2006.01)
(52) U.S. Cl.
  CPC .......... *H01L 24/95* (2013.01); *H01L 25/0753* (2013.01); *H01L 25/167* (2013.01); *H01L 2224/10145* (2013.01); *H01L 2224/11002* (2013.01); *H01L 2224/11464* (2013.01); *H01L 2224/13007* (2013.01); *H01L 2224/13021* (2013.01); *H01L 2224/13022* (2013.01); *H01L 2224/81815* (2013.01)
(58) Field of Classification Search
  USPC .................................................. 257/98, 433
  See application file for complete search history.

(56) References Cited

U.S. PATENT DOCUMENTS

| | | | |
|---|---|---|---|
| 8,395,267 B2 | 3/2013 | Roozeboom | |
| 8,440,505 B2 | 5/2013 | Kulkarni | |
| 8,507,317 B2 | 8/2013 | Bachman | |
| 8,791,540 B2 | 7/2014 | Ding | |
| 8,866,276 B2 | 10/2014 | Su | |
| 10,304,787 B2 | 5/2019 | Suzuki | |
| 2004/0208210 A1* | 10/2004 | Inoguchi | H01L 25/0753 372/36 |
| 2004/0219774 A1 | 11/2004 | Shen | |
| 2008/0251927 A1 | 10/2008 | Zhao et al. | |
| 2011/0273410 A1 | 11/2011 | Park | |
| 2012/0248625 A1 | 10/2012 | Coffy | |
| 2013/0256871 A1* | 10/2013 | Topacio | H01L 23/3171 257/737 |
| 2014/0153238 A1* | 6/2014 | Nishimura | H01L 25/0753 362/237 |
| 2014/0367659 A1* | 12/2014 | Cho | H01L 27/3276 257/40 |
| 2015/0333221 A1 | 11/2015 | Bibl | |
| 2016/0155892 A1* | 6/2016 | Li | H01L 24/00 257/89 |
| 2017/0047393 A1* | 2/2017 | Bower | G06F 3/044 |
| 2017/0103926 A1 | 4/2017 | Aoyagi | |
| 2017/0148760 A1 | 5/2017 | Murai et al. | |
| 2017/0294418 A1* | 10/2017 | Edmond | H01L 25/0753 |
| 2017/0345801 A1* | 11/2017 | Lin | H01L 25/0753 |
| 2017/0373046 A1* | 12/2017 | Gardner | H01L 25/0753 |

FOREIGN PATENT DOCUMENTS

| | | |
|---|---|---|
| WO | 20120102303 A1 | 8/2012 |
| WO | WO 2015/151797 A1 | 10/2015 |
| WO | WO 2015/175131 A1 | 11/2015 |

OTHER PUBLICATIONS

PCT Invitation to Pay Additional Fees for International Application No. PCT/US2017/017532, dated Apr. 7, 2017, 8 pages.
PCT/US2017/017532, International Preliminary Report on Patentability, dated Aug. 30, 2018, 14 pgs.

* cited by examiner

BACKPLANE STRUCTURE AND PROCESS FOR MICRODRIVER AND MICRO LED

CROSS-REFERENCE TO RELATED APPLICATIONS

This patent application is a U.S. National Phase Application under 35 U.S.C. § 371 of International Application No. PCT/US2017/017532, filed Feb. 10, 2017, entitled BACKPLANE STRUCTURE AND PROCESS FOR MICRODRIVER AND MICRO LED which claims the benefit of priority of U.S. Provisional Application No. 62/297,113 filed Feb. 18, 2016, both of which are incorporated herein by reference.

BACKGROUND

Field

Embodiments described herein relate to display backplanes. More particularly, embodiments relate to micro device integration techniques for micro LED displays.

Background Information

State of the art displays for phones, tablets, computers, and televisions utilize glass substrates with thin film transistor (TFTs) to control transmission of backlight though pixels based on liquid crystals. More recently emissive displays such as those based on organic light emitting diodes (OLEDs) have been introduced as being more power efficient, and allowing each pixel to be turned off completely when displaying black. Even more recently, it has been proposed to incorporate emissive inorganic semiconductor-based micro LEDs into high resolution displays. Compared to OLEDs, inorganic semiconductor-based micro LEDs may be more energy efficient and also may not be prone to lifetime degradation and extreme sensitivity to moisture.

SUMMARY

Embodiments describe microdriver chips and display backplane integration schemes. In an embodiment, a microdriver chip includes a device layer and a passivation layer below the device layer. The passivation layer includes a bottom surface. A plurality of trenches is formed in the passivation layer, and a plurality of conductive studs is located within the plurality of trenches. Each conductive stud may extend from a landing pad beneath the passivation layer. Each conductive stud is surrounded by sidewalls of a corresponding trench such that a reservoir is formed between the conductive stud and the sidewalls of the corresponding trench. In accordance with embodiments, each conductive stud includes a bottom surface that is below the bottom surface of the passivation layer.

A barrier layer may be formed on the bottom surface of the passivation layer and on the sidewalls of the plurality of trenches. The barrier layer may also be formed on the plurality of landing pads. In an embodiment, the barrier layer is thinner than the passivation layer.

In an embodiment, a display substrate includes an array of contact pads. An array of LEDs is bonded to the display substrate, and an array of chips is bonded to the display substrate, and each chip is electrically connected to one or more LEDs to drive the one or more LEDs. In an embodiment, each chip includes a passivation layer including a plurality of trenches, and a plurality of conductive studs within the plurality of trenches and extended below a bottom surface of the passivation layer. Each conductive stud is bonded to a contact pad with a solder material that is reflowed into a corresponding trench. In an embodiment, an array of conductive terminal lines is on the display substrate, and a top contact layer is on and in electrical connection with the array of LEDs, and on and in electrical connection with the array of conductive terminal lines. In an embodiment, an array of conductive terminal posts is on the display substrate, and a top contact layer is on and in electrical connection with the array of LEDs, and on and in electrical connection with the array of conductive terminal posts. A patterned insulating layer may additionally cover edges of the array of contact pads, with each chip bonded to a plurality of the contact pads directly over a correspond portion of the patterned insulating layer.

In an embodiment, a display includes a display substrate, a plurality of contact pads on the display substrate, a chip bonded to the plurality of contact pads, a bank structure adjacent to the chip, a trace line electrically connecting one of the plurality of contact pads to an LED contact pad on top of the bank structure, and an LED bonded to the LED contact pad. In an embodiment, the trace line runs along a sidewall of the bank structure. A passivation fill layer may be around the sidewalls of the LED and the chip, and a top contact layer spans over the passivation fill layer, the LED, and the chip, with the top contact layer on and in electrical contact with the LED and a conductive terminal contact.

In an embodiment, the bank structure includes a first bank level and a second bank level on the first bank level, with the conductive terminal contact on the second bank level. The second bank level may be integrally formed with the first bank level.

In an embodiment, an opening is formed in the passivation fill layer over the conductive terminal contact. The conductive terminal contact may be on the bank structure, and the top contact layer spans along sidewalls of the opening in the passivation fill layer.

In an embodiment, a second bank structure is laterally adjacent to the bank structure. An opening may be formed in the passivation fill layer over the conductive terminal contact. The conductive terminal contact may be on the second bank structure, and the top contact layer spans along sidewalls of the opening in the passivation fill layer.

In accordance with embodiments, a patterned insulating layer may optionally cover edges of the plurality of contact pads, and the chip is bonded to the plurality of contact pads directly over a portion of the patterned insulating layer. In accordance with embodiments, the passivation fill layer may include a level top surface and a conformal bottom surface. For example, the bottom surface may be conformal to a topography of a conductive terminal contact on the bank structure, and the trace line electrically connecting one of the plurality of contact pads to the LED contact pad. In accordance with embodiments, the chip may include a device layer and a passivation layer below the device layer. A plurality of trenches is in the passivation layer and a plurality of conductive studs are within the plurality of trenches such that the plurality of conductive studs extend below a bottom surface of the passivation layer. Each conductive stud may be bonded to a corresponding contact pad with a solder material that is reflowed into a corresponding trench.

DETAILED DESCRIPTION

Figure 1:
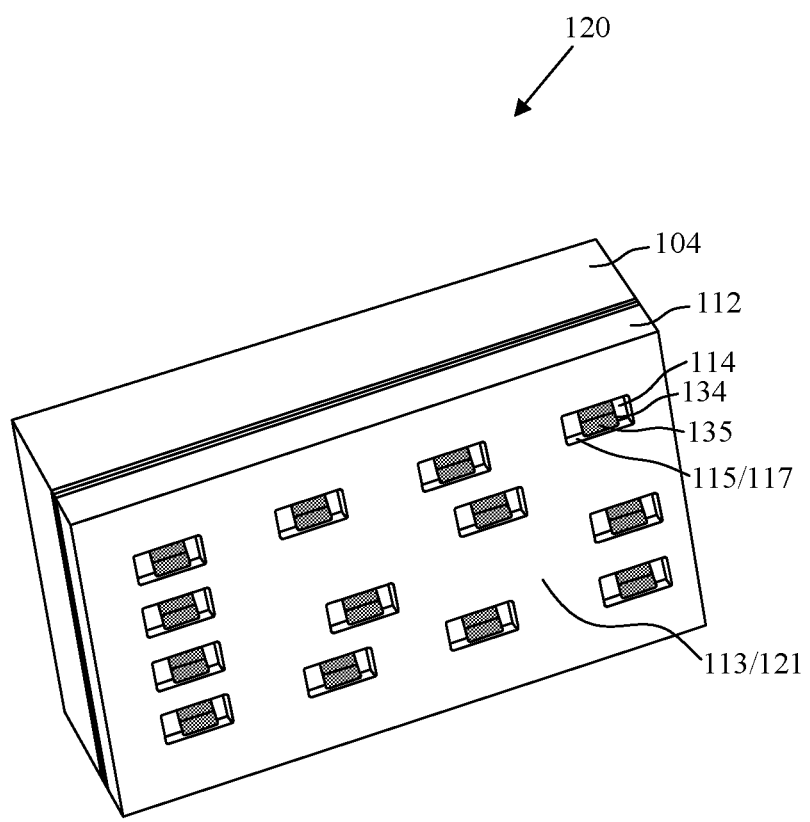
FIG. 1 is a perspective view of a microdriver chip in accordance with an embodiment.

Embodiments describe various methods and structures for integrating and functionalizing micro LEDs and micro chips on a display substrate. In particular, embodiments are related to the integration and functionalization of micro LEDs adjacent to micro chips (e.g. microdriver chips) that include circuitry for driving the micro LEDs. In accordance with embodiments, the micro LEDs may be formed of inorganic semiconductor-based materials, and have maximum lateral dimensions between sidewalls of 1 to 300 µm, 1 to 100 µm, 1 to 20 µm, or more specifically 1 to 10 µm, such as 5 µm. In accordance with embodiments, the micro LEDs may be vertical LEDs including a bottom electrode bonded to a contact pad (e.g. driver pad) on the display substrate, and a top electrode that is electrically connected with a conductive terminal structure by a top contact layer. For example, a conductive terminal structure and corresponding signal may be a ground line or some other low voltage (Vss) or reverse bias, power supply plane or some other high voltage level (Vdd), current source output, or voltage source output. In accordance with embodiments the micro chips (e.g. microdriver chips) may have a maximum lateral dimension of 1 to 300 µm, and may fit within the pixel layout of the micro LEDs. In accordance with embodiments, the microdriver chips can replace the driver transistors for each display element as commonly employed in a thin film transistor (TFT) substrate architecture. The microdriver chips may include additional circuitry such as the switching transistors, emission control transistors, and even storage devices for each display element. The microdriver chips may include digital circuitry, analog circuitry, or hybrid circuitry. Additionally, MOSFET processing techniques may be used for fabrication of the microdriver chips on single crystalline silicon as opposed to TFT processing techniques on amorphous silicon or low temperature poly silicon commonly employed for conventional display backplane substrates.

In one aspect, embodiments describe micro chip (e.g. microdriver chip) integration schemes in which the micro chip is designed for ultra fine pitch bonding to the display substrate. In accordance with the embodiments, an increased amount of circuitry offloaded from the display backplane substrate into the microdriver chips results in an increased number of contacts the microdriver chip has with the display substrate. Furthermore, the number of contacts increases as the number of micro LEDs increases that are driven by a single microdriver chip. For example, a single microdriver chip may drive one or more LEDs within multiple pixels. Exemplary contacts include, but are not limited to, micro LED driver contact, Vdd, power supply, Vss, ground, data signal input, scan signal input, emission control signal input, reference voltage/current, etc.

In one exemplary implementation, a display includes a red-green-blue (RGB) pixel layout. By way of example, this may be compatible with 1920×1080 or 2560×1600 resolutions. In such an RGB arrangment each pixel includes a red emitting subpixel, a green emitting subpixel, and a blue emitting subpixel. However, the specific resolution and RGB color scheme is for illustrational purposes only, and embodiments are not so limited. Other exemplary pixel arrangements include red-green-blue-yellow-cyan (RBGYC), red-green-blue-white (RGBW), or other sub-pixel matrix schemes where the pixels have a different number of sub-pixels).

By way of example, each subpixel may be characterized by a horizontal dimension (x) and vertical dimension (y). Various exemplary dimensions for an RGB color scheme are provided in Table 1 for illustrational purposes only in order to provide a reference for potential alignment tolerances in accordance with embodiments.

TABLE 1

| Pixel pitch (x, y) | Subpixel pitch (x, y) | Pixels per inch (PPI) |
| --- | --- | --- |
| (634 µm, 634 µm) | (211 µm, 634 µm) | 40 |
| (85 µm, 85 µm) | (28 µm, 85 µm) | 299 |
| (78 µm, 78 µm) | (26 µm, 78 µm) | 326 |
| (58 µm, 58 µm) | (19 µm, 58 µm) | 440 |
| (39 µm, 39 µm) | (13 µm, 39 µm) | 652 |

Thus, as demonstrated in Table 1, as the pixel density (PPI) increases, the subpixel pitch, particularly the exemplary horizontal dimension (x) per subpixel, is reduced. In an exemplary display incorporating micro LEDs with an exemplary maximum lateral dimension (x, y) of 10 μm or 5 μm the horizontal dimension (x) of the subpixel approaches that of the LEDs as PPI increases. Furthermore, the available space for the microdriver chips is additionally constrained. In an embodiment including an array of microdriver chips bonded to a high resolution display, the available space between adjacent contacts (e.g. conductive studs) on a microdriver chip is reduced, particularly where more complex circuitry is contained within the microdriver chip. In accordance with embodiments, the available space between adjacent contacts can be less than several microns, e.g. 1-15 μm, such as 1-6 μm.

In an embodiment, each microdriver chip is bonded to a plurality of contact pads on a display substrate utilizing a solder material. In order to inhibit lateral flow of the solder material between adjacent contact pads, each microdriver chip includes a plurality of conductive studs within a corresponding plurality of trenches formed in a passivation layer. When the microdriver chip is bonded to the contact pads on the display substrate the solder material reflows within the trenches, which act as reservoirs to collect the reflowed solder material. In addition, the solder material may preferentially wet the conductive studs as opposed to a barrier material (e.g. $Al_2O_3$) that is formed along the bottom surface of the microdriver chips. This preferential wetting may additionally function to retain the reflowed solder material within the microdriver chip trenches. In accordance with some embodiments, a patterned insulating layer may alternatively, or additionally, be provided on the display substrate covering edges of the array of contact pads in order to act as a barrier to solder material reflow (and electrical shorting) across adjacent contact pads.

In accordance with embodiments, a passivation fill layer is applied around sidewalls of the micro LEDs and the microdriver chips on the display substrate. The passivation fill layer may function to secure the micro LEDs and microdriver chips on the display substrate, passivate sidewalls of the micro LEDs (e.g. prevent shorting between top/bottom electrodes of the vertical micro LEDs), and provide step coverage for the application of a top contact layer that electrically connects the micro LEDs to the conductive terminal structure (for example, Vss, ground, etc.).

In one aspect, embodiments describe various bank structure configurations and pillar structures on a display substrate for raising the conductive terminal contact top surface and/or micro LED top surface to compensate for a height difference with the top surface of a microdriver chip.

In one aspect, raised micro LEDs can potentially reduce low angle light scattering that results from reflection of emitted light off of adjacent microdriver chips. For example, microdriver chips formed of silicon may act as a mirror reflecting emitting light from adjacent micro LEDs, potentially reducing optical performance of the display at certain viewing angles. In an embodiment, bonding a micro LED on a raised bank structure can reduce the amount of low angle light scatting.

In one aspect, raised micro LEDs may reduce coupling with signal lines buried in the display substrate, and RC delay that could potentially result. In an embodiment, bonding a micro LED on a raised bank structure can provide additional insulation to reduce coupling.

In one aspect, raised micro LEDs and/or raised conductive terminal contacts can mitigate alignment tolerances for making electrical contact with the top conductive layer. In one aspect, various bank structures are described in which the top surface of a micro LED is within at least 2 μm, or more specifically within 0.5 μm of the top surface of an adjacent microdriver chip. In some embodiments, the top surface of the micro LED and the top surface of the microdriver chip are both above or level with the top surface of the passivation fill layer. In some embodiments the passivation fill layer is formed by slit coating across the entire display area of the display substrate. The top surface of the passivation fill layer may raise to the top surface of the tallest components (e.g. the microdriver chips) so that the blade of the slit coating apparatus clears the microdriver chips without damaging the microdriver chips.

Referring now to FIG. 1 a perspective view of a microdriver chip is provided in accordance with an embodiment. In particular, FIG. 1 is provided to show the relationship of the plurality of conductive studs 134 and plurality of trenches 114 surrounding the conductive studs 134 in accordance with embodiments. As illustrated, a microdriver chip 120 may include a device layer 104, and a passivation layer 112 below the device layer 104. The passivation layer 112 includes a bottom surface 113. A plurality of trenches 114 are formed in the passivation layer, and a plurality of conductive studs 134 are located within the plurality of trenches 114. Each conductive stud 134 may extend from a landing pad beneath the passivation layer 112. Each conductive stud 134 is surrounded by sidewalls 115 of a corresponding trench 114 such that a reservoir is formed between the conductive stud 134 and the sidewalls 115 of the corresponding trench 114. In accordance with embodiments, each conductive stud 134 includes a bottom surface 135 that is below the bottom surface 113 of the passivation layer 112.

While not separately visible in the image provided in FIG. 1, a thin, conformal barrier layer 116 may be formed on the bottom surface 113 of the passivation layer 112 and on the sidewalls 115 of the plurality of trenches 114. The barrier layer may also be formed on the plurality of landing pads. The barrier layer 116 formed on the bottom surface 113 of the passivation layer 112 may form the bottom surface 121 of the microdriver chip 120. The barrier layer 116 may additionally include sidewalls 117 that are formed on and are conformal to sidewalls 115 of the passivation layer 112. In an embodiment in which a barrier layer 116 is not formed, the bottom surface 113 of the passivation layer 112 may correspond to the bottom surface 121 of the microdriver chip 120.

FIGS. 2-10 are schematic cross-sectional side view illustrations of a method of fabricating an array of microdriver chips 120 in accordance with an embodiment. In an embodiment, the microdriver chips 120 are fabricated in a single crystalline silicon wafer. For example, the fabrication substrate may include a silicon wafer 102 and a device layer 104 formed on the silicon wafer 102. For example, the device layer 104 may be an epitaxial layer grown on the silicon wafer 102. The substrate stack may additionally be a silicon on insulator (SOI) wafer including a buried oxide layer beneath the device layer 104. The microdriver chip devices (e.g. driver transistors, emission control transistors, switching transistors, etc.) may be formed in the device layer and interconnected in the build-up layer 106, which may include one or more interconnect layers (e.g. copper interconnects) and insulating layers (e.g. interlayer dielectrics, ILDs), culminating in a plurality of landing pads 110 at the top of the build-up layer 106. For example, the landing pads 110 may be formed of copper.

Figure 2:
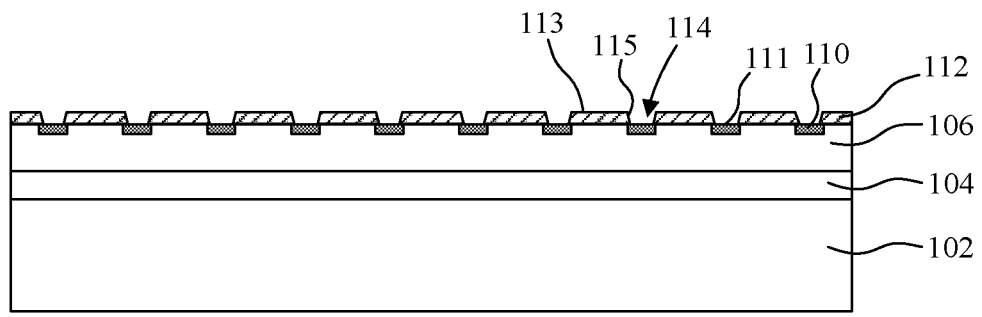
FIGS. 2-10 are schematic cross-sectional side view illustrations of a method of fabricating an array of microdriver chips in accordance with an embodiment.
Figure 3:
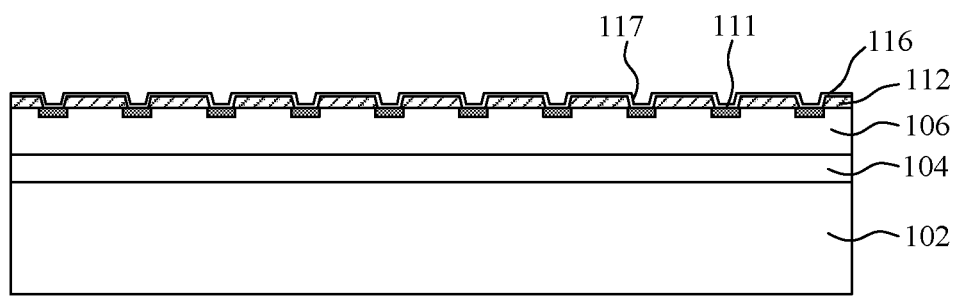

In the embodiment illustrated in FIG. 2 a passivation layer 112 is formed over the build-up layer 106 and patterned to create trenches 114 through the passivation layer 112 that expose the top surfaces 111 of the corresponding landing pads 110. In an embodiment, trenches have a maximum width of 1-10 μm, such as 1-5 μm. In an embodiment, the landing pads 110 are wider than the trenches 114 so that only the landing pad 110 top surfaces 111 are exposed at the bottom of the trenches 114. Passivation layer 112 may be formed from a variety of suitable materials, including oxide, nitrides (e.g. $SiN_x$), polymers (e.g. polyimide, epoxy, etc.). Referring to FIG. 3, a barrier layer 116 may then optionally be formed over the passivation layer 112, within trenches 114 and on the top surfaces 111 of the landing pads 110. In accordance with embodiments the barrier layer 116 may provide chemical protection during an etch-release operation of the microdriver chips 120. The barrier layer 116 may additionally provide a non-wetting surface for solder reflow. The barrier layer 116 may be formed using a conformal deposition technique, such as atomic layer deposition (ALD). In an embodiment, barrier layer 116 is formed $Al_2O_3$. In an embodiment the barrier layer 116 is less than 2,000 Angstroms (0.2 μm) thick.

Referring now to FIG. 3 chiplet trenches 122 are then formed through the passivation layer 112, build-up layer 106, and device layer 104 to define an array of chiplets 119. In an embodiment, the chiplet trenches 122 stop on the silicon wafer 102 (or buried oxide layer). Exemplary trenches may be approximately 1 μm wide, and 5-10 deep (e.g. total thickness of the barrier layer 116, passivation layer 112, build-up layer 106, and device layer 104). Chiplet trenches 122 may be formed using a suitable dry etching technique such as inductively coupled plasma reactive-ion etching (ICP-RIE).

Figure 5:
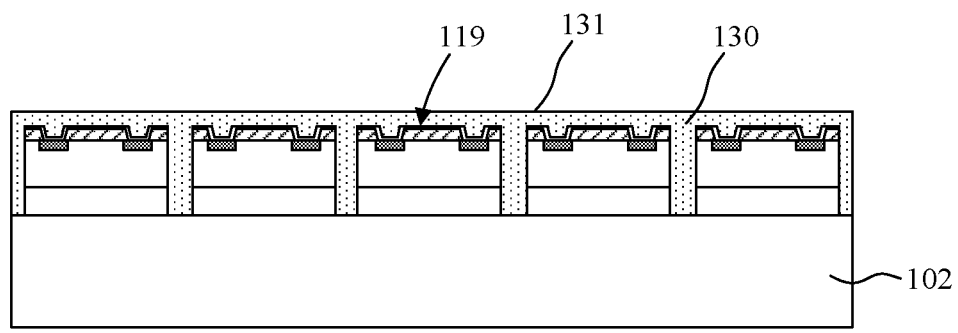

A sacrificial release layer 130 may then be formed over the array of chiplets 119 and within the chiplet trenches 122 as illustrated in FIG. 5. In an embodiment, the sacrificial release layer 130 is formed of a material that can be selectively removed with regard to the other materials forming the chiplets 119. In an embodiment sacrificial release layer 130 is formed of an oxide (e.g. $SiO_2$), though other materials may be used. Sacrificial release layer 130 may be formed using a suitable technique capable of filling the chiplet trenches 122 such as sputtering, low temperature plasma enhanced chemical vapor deposition (PECVD), or electron beam evaporation. A polishing operation may optionally be performed after deposition to create a level top surface 131.

Figure 4:
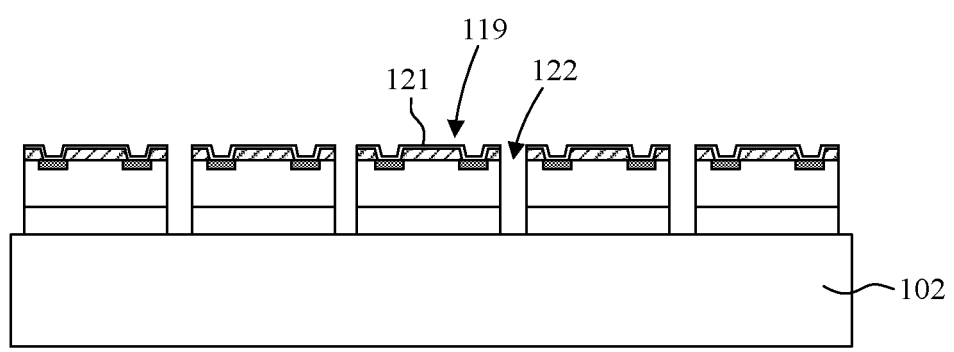

In an alternative embodiment, the barrier layer 116 may be formed after the formation of chiplet trenches 122 illustrated in FIG. 4, and prior to deposition of the sacrificial release layer 130. In such an embodiment, the barrier layer 116 also spans along the sidewalls of the chiplets 119, and within the chiplet trenches 122. In such an embodiment, the barrier layer 116 may provide additional chemical protection along sidewalls of the microdriver chips 120 during an etch-release operation.

Figure 6:
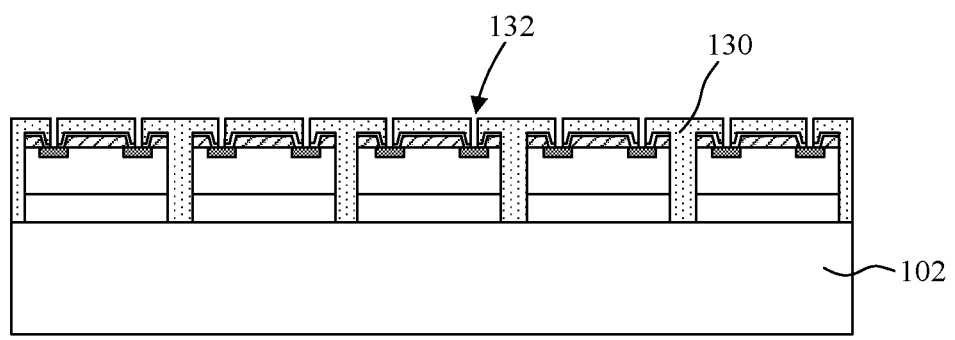
Figure 7:
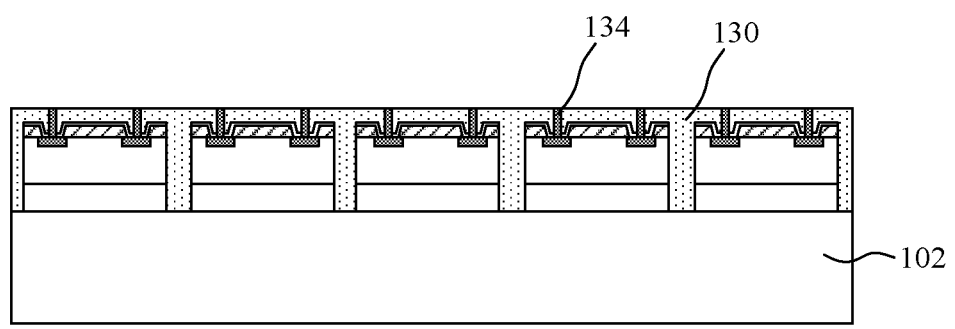

Referring now to FIG. 6, stud-openings 132 are formed through the sacrificial release layer 130 and optional barrier layer 116 to expose the landing pads 110. As illustrated, the stud-openings 132 may be narrower than the trenches 114 formed in the passivation layer 112. This will allow for the trenches to function as reservoirs in the final structure. The stud-openings 132 are then filled with an electrically conductive material to form conductive studs 134. For example, conductive studs 134 may be formed of copper, and may be formed using an electroless plating technique using the sacrificial release layer 130 as a plating mold.

Figure 8:
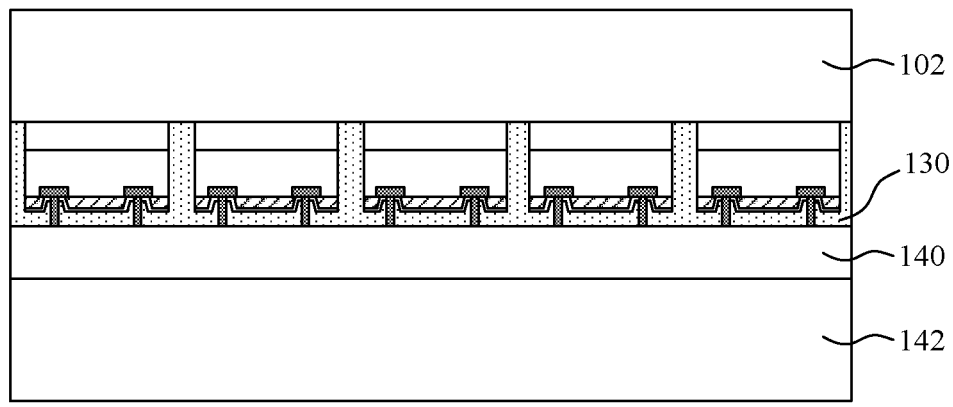
Figure 9:
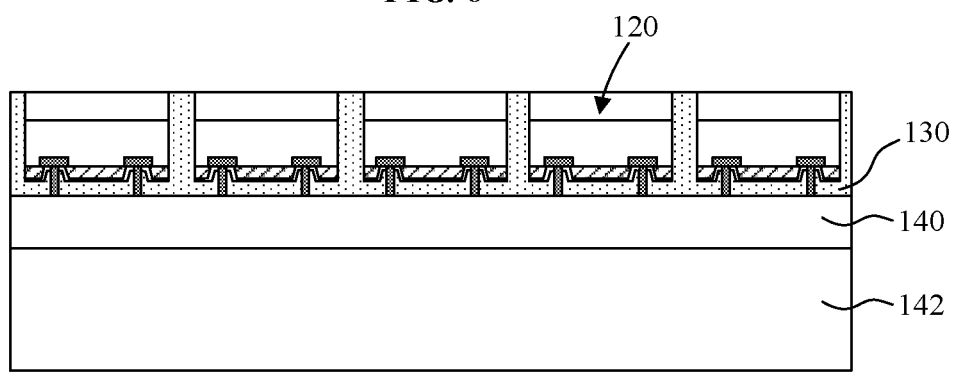
Figure 10:
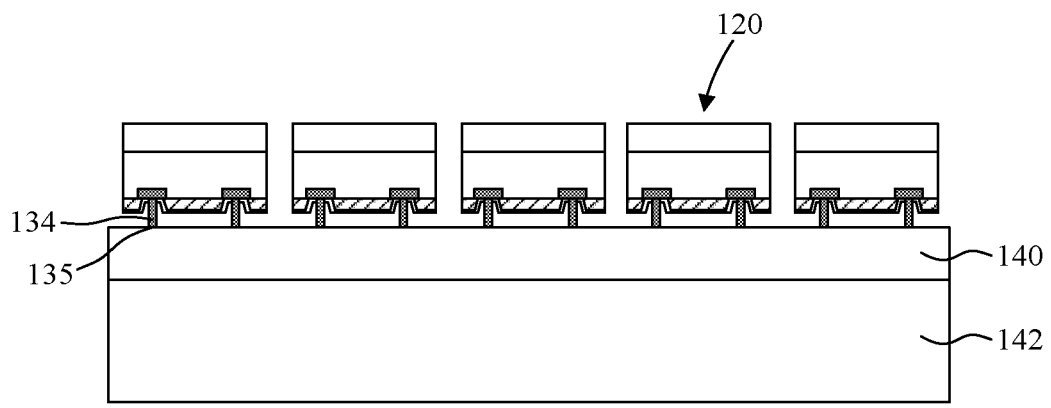

Referring now to FIG. 8, the substrate stack is then bonded to a carrier substrate 142 with a stabilization layer 140. For example, stabilization layer 140 may be formed of an adhesive bonding material such as benzocyclobutene (BCB) or epoxy, and may be cured during bonding to form a cross-linked thermoset. In an embodiment, the carrier substrate 142 is a silicon wafer, though other substrates may be used. The silicon wafer 102 may then be removed using suitable process techniques such as grinding, or etching and grinding to expose the sacrificial release layer 130 within the chiplet trenches 122 as illustrated in FIG. 9, followed by removal of the sacrificial release layer 130, as illustrated in FIG. 10, resulting in an array of microdriver chips 120 supported on a carrier substrate 142 by the stabilization layer 140. In an embodiment, the sacrificial release layer 130 is selectively removed using a suitable etching chemistry such as HF vapor, though other chemistries may be used depending upon composition of the sacrificial release layer 130. The microdriver chips 120 illustrated in FIG. 10 are adhered to the stabilization layer 140 by the contact area of the bottom surfaces 135 of the conductive studs 134 in contact with the stabilization layer 140. The array of microdriver chips 120 are now poised for pick up and transfer to, and bonding to, a display substrate.

Figure 11:
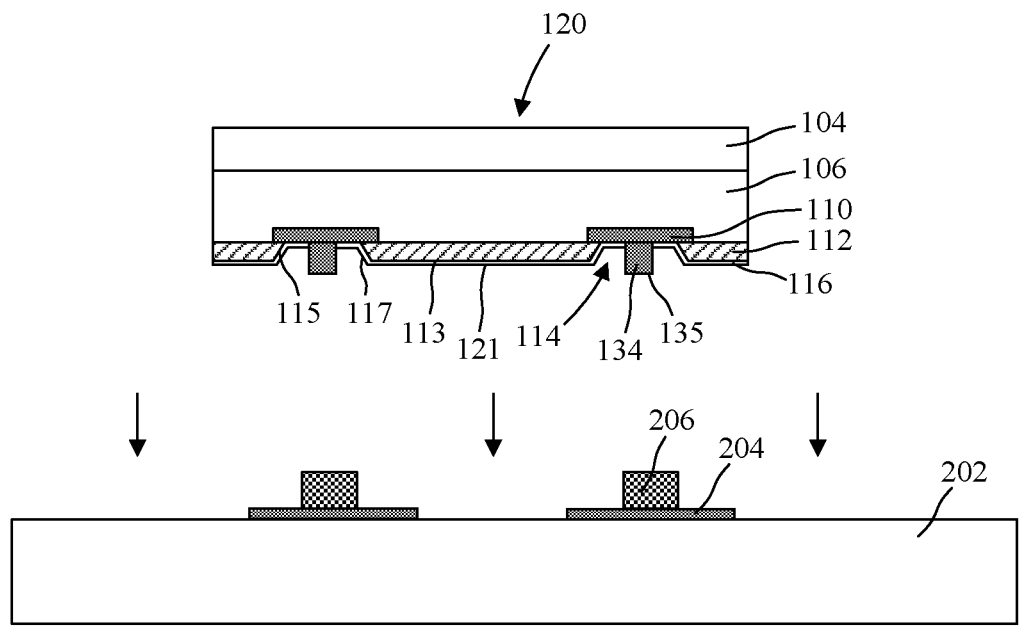
FIG. 11 is a schematic cross-sectional side view illustration of a microdriver chip over a display substrate in accordance with an embodiment.

Referring now to FIG. 11, a schematic cross-sectional side view illustration is provided of a microdriver chip 120 over a display substrate 202, and prior to being bonded to the display substrate 202, in accordance with an embodiment. As illustrated, the portion of the display substrate 202 that will receive the microdriver chip 120 includes a plurality of contact pads 204, each including a solder material 206 deposited thereon. Contact pads 204 may be formed of a variety of electrically conductive materials, such as copper and aluminum, and may include a layer stack. For example, the contact pads 204 may include an adhesion/barrier layer (e.g. TaN) to prevent diffusion into an underlying conductive layer (e.g. copper, aluminum).

In an embodiment, trenches 114 have a maximum width of 1-10 um, such as 1-5 um, with conductive studs 134 having maximum width of 0.5-5 um, such as 1-3 um. In an embodiment, adjacent trenches 114 may be separated by a width as little as several microns, e.g. 1-15 μm, such as 1-6 μm. In an embodiment, the separate locations of the solder material 206 are wider than the corresponding conductive studs 134. As shown, the conductive studs 134 may be thicker (taller) than the passivation layer 112 and barrier layer 116 such that bottom surfaces 135 of the conductive studs 134 are below a bottom surface 121 of the microdriver chip 120, for example, in the range of 0.2-2 μm. In an embodiment, a total thickness of the body of the microdriver chip 120 (excluding the conductive studs 134) is 3-20 μm, such as 5-10 μm, or 8 μm.

Figure 12:
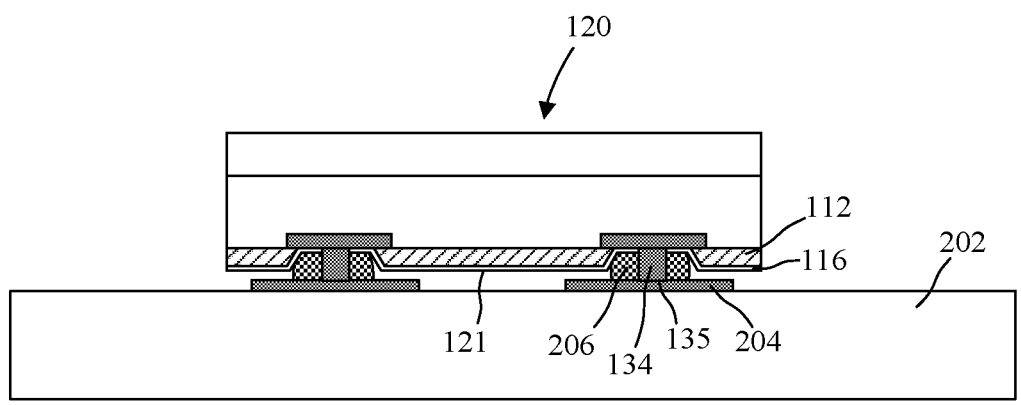
FIG. 12 is a schematic cross-sectional side view illustration of a microdriver chip bonded to a display substrate in accordance with an embodiment.

FIG. 12 is a schematic cross-sectional side view illustration of a microdriver chip 120 bonded to a display substrate 202 in accordance with an embodiment. In an embodiment, the conductive studs 134 pierce through the solder material 206. In accordance with embodiments, the bonding operation may be performed at an elevated temperature in order to liquefy the solder material 206, which reflows and is contained by the trenches 114 formed in the microdriver chip 120. In this manner, the trenches 114 may inhibit the potential for electrical shorting across adjacent contact pads 204 or conductive studs 134 due to excess reflow of the solder material 206.

In accordance with embodiments, the conductive studs 134 provide an increased surface area for contact with the solder material 206. The increased contact area may additionally provide an increased relative area for preferential wetting of the solder material 206 compared to the barrier layer 116 material. This preferential wetting may additionally mitigate lateral spreading of the reflowed solder material 206 between adjacent contact pads 204.

In another aspect, the conductive studs 134 may create a profile that allows for a metal-metal contact with the contact pads 204, which can potentially act as a cushion during the transfer and bonding operation, and potentially preserve the mechanical integrity of the microdriver chips 120. In such a configuration, the metal or metal alloy materials forming the conductive studs 134 and contact pads 204 may be relatively softer than other materials on the microdriver chip 120 or display substrate 202, such as an $Al_2O_3$ barrier layer 116. In this manner, a relatively soft-soft contact is created as opposed to a soft-hard, or hard-hard contact.

Figure 13:
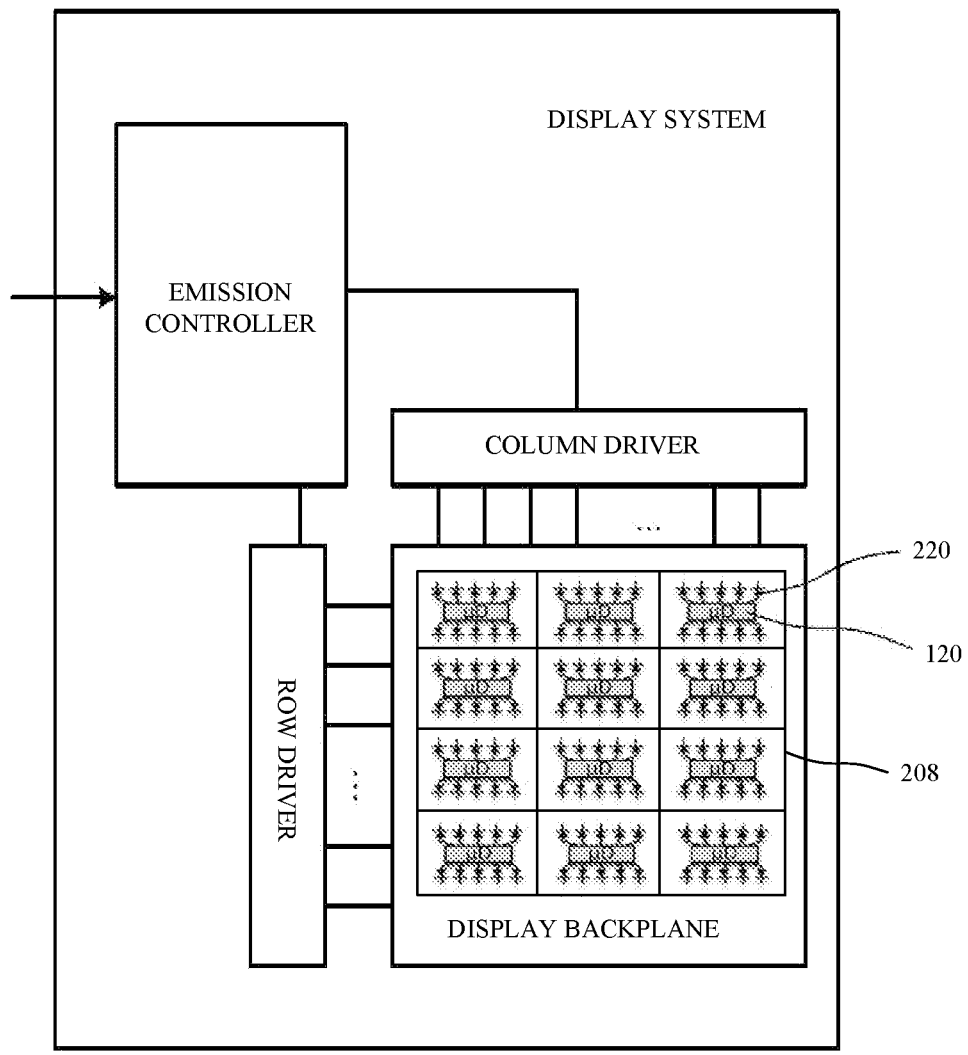
FIGS. 13-14 are schematic top view illustrations of display systems including an array of microdriver chips and micro LEDs in accordance with an embodiment.
Figure 14:
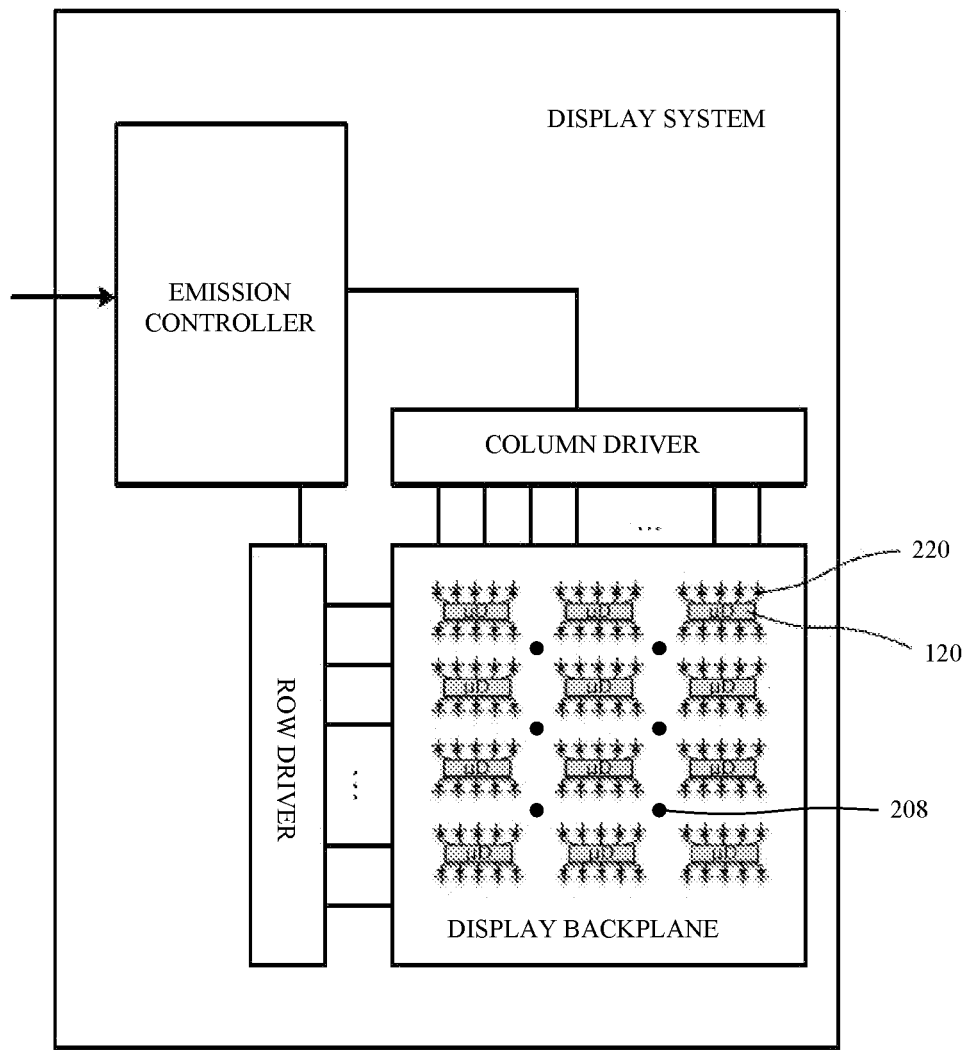

FIGS. 13-14 are schematic top view illustrations of display systems including an array of microdriver chips 120 and micro LEDs 220 in accordance with an embodiment. The emission controller may receive as an input the content to be displayed on (e.g., all or part of) a display backplane, e.g., an input signal corresponding to the picture information (e.g., a data frame). Emission controller may include a circuit (e.g., logic) to selectively cause a micro LED 220 to emit (e.g., visible to a human eye) light. An emission controller may cause a storage device(s) (e.g., a capacitor or a data register) to receive a data signal (e.g., a signal to turn a micro LED 220 off or on). A column driver and/or row driver may be a component of the emission controller. A column driver may allow the emission controller to communicate with (e.g., control) a column of microdriver chips 120. A row driver may allow the emission controller to communicate with (e.g., control) a row of microdriver chips 120. A column driver and a row driver may allow an emission controller to communicate with (e.g., control) an individual microdriver chips 120 or a group of microdriver chips 120.

In an embodiment, one or more micro LEDs 220 may connect to a microdriver chip 120 that drives (e.g., according to the emission controller) the emission of light from the one or more micro LEDs 220. For example, the microdriver chips 120 and micro LEDs 220 may be surface mounted on the display substrate of the display backplane. Although the depicted microdriver chips 120 include ten micro LEDs 220, the disclosure is not so limited and a microdriver chip 120 may drive one micro LED 220 or any plurality of micro LEDs 220 and a plurality of pixels.

In one embodiment, a display driver hardware circuit (e.g., a hardware emission controller) may include one or more of: (e.g., row selection) logic to select a number of rows in an emission group of a display panel, in which the number of rows is adjustable from a single row to a full panel of the display panel, (e.g., column selection) logic to select a number of columns in the emission group of the display panel, in which the number of columns is adjustable from a single column to the full panel of the display panel, and (e.g., emission) logic to select a number of pulses per data frame to be displayed, in which the number of pulses per data frame is adjustable from one to a plurality and a pulse length is adjustable from a continuous duty cycle to a non-continuous duty cycle. An emission controller may include hardware, software, firmware, or any combination thereof.

Referring now to FIG. 13, in the embodiment illustrated an array of conductive terminal contacts 208 is illustrated as an arrangement of lines between rows and columns of micro LEDs 220 and microdriver chips 120 for electrically connecting the micro LEDs 220 to the conductive terminal structure. In the embodiment illustrated in FIG. 14 an array of conductive terminal contacts 208 is illustrated as an arrangement of separate locations (e.g. pillars or openings) for electrically connecting the micro LEDs 220 to the conductive terminal structure.

In the following description and figures, various cross-sectional side views of integration schemes are provided for integrating micro LEDs 220 and microdriver chips 120 on a display substrate 202, and for electrically connecting the micro LEDs 220 to conductive terminal structures, for example with a top contact layer 240. In accordance with embodiments, the top contact layer 240 may make electrical contact with the conductive terminal contacts 208 in a variety of configurations, and areas. For example, electrical contact may be made along linear lengths of exposed lines or openings in a passivation fill layer 230 (e.g. FIG. 13), or at discrete locations along exposed posts or openings in a passivation fill layer 230 (e.g. FIG. 14).

Figure 15:
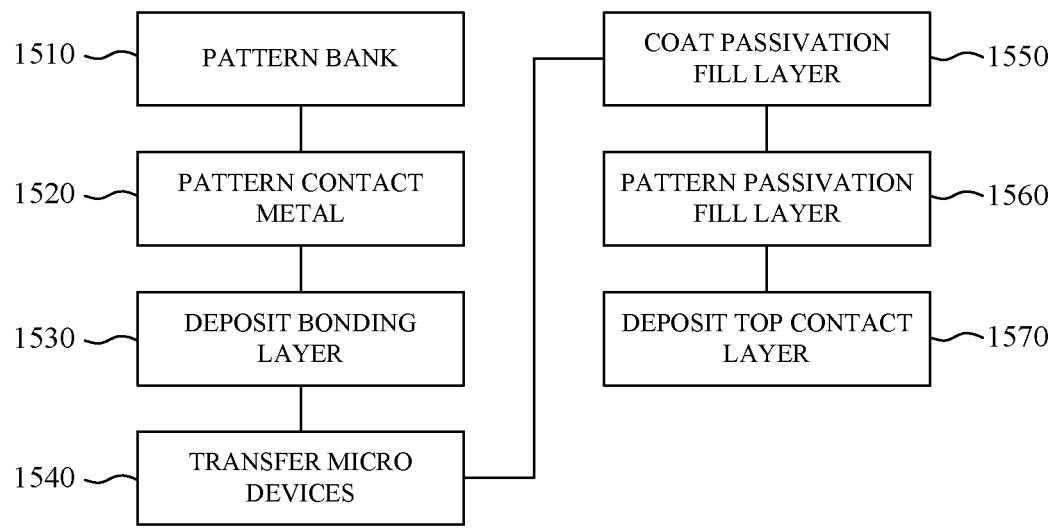
FIG. 15 is a flow chart illustrating a method of integrating micro devices on a display substrate in accordance with an embodiment.
Figure 16:
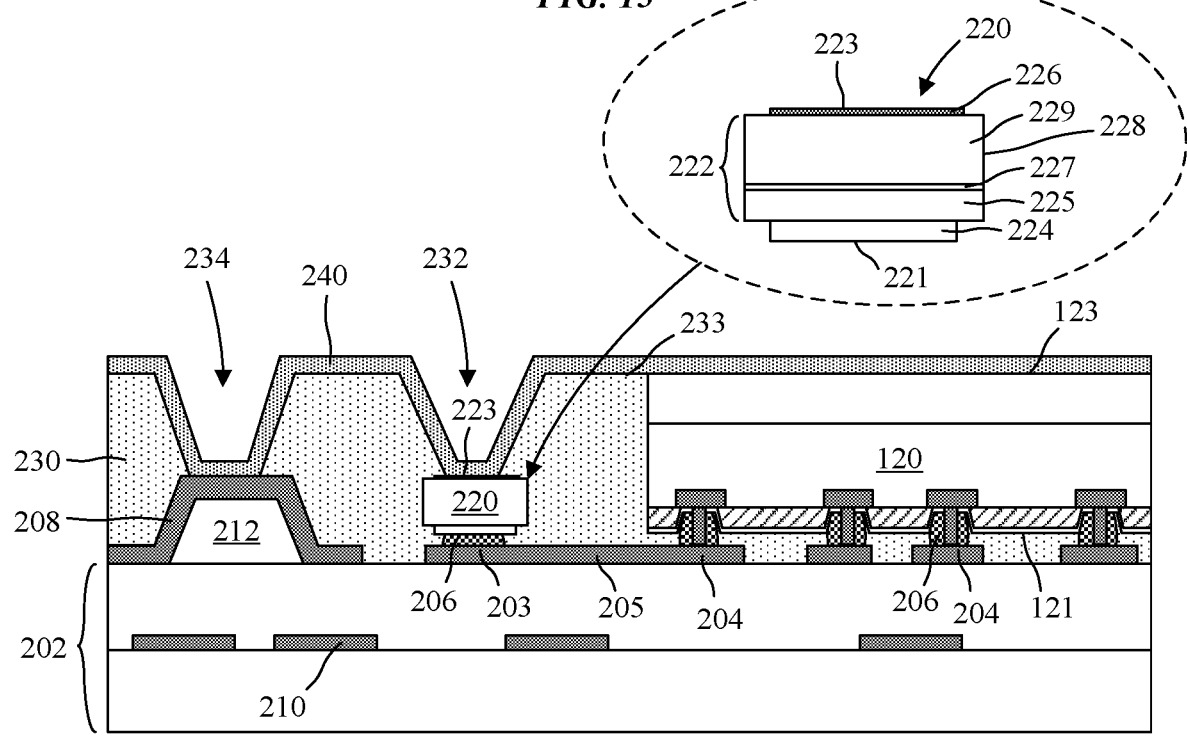
FIG. 16 is a schematic cross-sectional side view illustration of a portion of an integrated display substrate with a patterned passivation fill layer in accordance with an embodiment.

Referring now to FIG. 15 a flow chart is provided illustrating a method of integrating micro devices on a display substrate 202 in accordance with an embodiment. FIG. 16 is a schematic cross-sectional side view illustration of a portion of an integrated display substrate 202 with a patterned passivation fill layer 230 in accordance with an embodiment. In interest of clarity, FIGS. 15-16 are described concurrently, with reference to the same reference numbers for like features.

At operation 1510 a bank structure 212 is patterned on a display substrate 202. The bank structure 212 may include one or more layers. For example, the bank structure 212 may include $SiO_2$, $SiN_x$ or a stack of $SiO_2$/$SiN_x$ with $SiN_x$ on top. The bank structure 212 may alternatively be formed of an organic (e.g. photoresist) material. The bank structure 212 may be in the form of lines or discrete, post-like, protrusions.

The display substrate 202 may be a variety of substrates. The display substrate 202 may be rigid or flexible. In an embodiment, the display substrate is a TFT substrate including partial working circuitry for operation of the display. For example, the TFT substrate may include working circuitry not included in the microdriver chips 120, as well as routing lines 210 (e.g. signal lines) for electrically connecting the microdriver chips 120 with system components, such as row drivers, column drivers, emission controllers, etc. In an embodiment, the display substrate 202 does not include any active devices of the working circuitry, but does include the routing lines 210 for electrical connection with the system components. Exemplary routing lines include, but are not limited to, Vdd lines, power lines, Vss lines, ground lines, data signal input lines, scan signal input lines, emission control signal input lines, reference voltage/current lines, etc.

At operation 1520 contact layers are patterned on the display substrate 202. In an embodiment, one or more metal layers are deposited and patterned to form a plurality of contact pads 204, LED contact pad 203, trace line 205 electrically connecting one of the contact pads 204 to the LED contact pad 203, and conductive terminal contact 208. In an embodiment, deposition and patterning of the metal layer comprises a lift-off technique. Alternatively, deposition and etching may be used. In an embodiment, contact pads 204, LED contact pad 203, trace line 205, and conductive terminal contact 208 may be formed of a variety of electrically conductive materials, such as copper and aluminum, and may include a layer stack. For example, these may include an adhesion/barrier layer (e.g. TaN) to prevent diffusion into an underlying conductive layer (e.g. copper, aluminum).

At operation 1530 bonding layers (e.g. solder material 206) are deposited on the contact pads 204 and LED contact pad 203. For example, the solder material 206 (e.g. In, Sn, etc.) may be deposited using an evaporation technique.

At operation 1540 the micro devices, including the microdriver chips 120 and micro LEDs 220 are transferred and bonded to the display substrate 202 using the solder material 206 as previously described with regard to FIG. 12.

A close-up view is provided of a micro LED 220 in FIG. 16. As illustrated, a micro LED 220 may include a micro p-n diode 222 including a doped layer 225 (e.g. p-doped), a doped layer 229 (e.g. n-doped), and an active layer 227 (e.g. including one or more quantum well layers) between the doped layers 225, 229. In an embodiment, the doping of doped layers 225, 229 is reversed. A top electrode 226 is formed on the top doped layer 229, and a bottom electrode 224 is formed on the bottom doped layer 225. The top and bottom electrodes may form the top surface 223 and bottom surface 221 of the micro LED 220. As shown, the micro LED 220 includes sidewalls 228 that may span lateral edges of the layers for the micro p-n diode 222. In accordance with embodiments the micro p-n diodes 222 may be fabricated using different II-VI or III-V inorganic semiconductor-based systems. For example, blue or green emitting micro p-n diodes 222 may be fabricated using inorganic semiconductor materials such as, but not limited to, GaN, AlGaN, InGaN, AlN, InAlN, AlInGaN, ZnSe. For example, red emitting micro p-n diodes 222 may be fabricated using inorganic semiconductor materials such as, but not limited to, GaP, AlP, AlGaP, AlAs, AlGaAs, AlInGaP, AlGaAsP, and any As—P—Al—Ga—In.

At operation 1550 a passivation fill layer 230 is coated onto the display substrate 202. As shown, the passivation fill layer 230 laterally surrounds the micro LEDs 220 and the microdriver chips 120. The passivation fill layer 230 may be a single layer formed over the entire display area of the display substrate 202. The passivation fill layer 230 may be formed of a dielectric material. The passivation fill layer 230 may be formed of a cross-linked material, such as acrylic or epoxy. The passivation fill layer 230 may be photo imagible. A variety of applications methods may be used to form the passivation fill layer 230 including spin coating, ink jetting, and slit coating. In an embodiment, the display substrate 202 is panel sized. In such an embodiment, slit coating may be utilized. A top surface of the passivation fill layer 230 may raise to, or above, the top surface of the tallest components (e.g. the microdriver chips) so that the blade of the slit coating apparatus clears the microdriver chips 120 without damaging the microdriver chips 120. Following formation of the passivation fill layer 230, an etch-back may optionally be performed to reduce a thickness of the passivation fill layer 230.

In an embodiment, the passivation fill layer 230 includes a level top surface 233 and a conformal bottom surface. As shown, the conformal bottom surface may be conformal to the topography onto which it is formed, including the topography of the conductive terminal contact 208 on the bank structure 212, and the trace line 205 electrically connecting the LED contact pad 203 to contact pad 204.

At operation 1560 the passivation fill layer 230 is patterned to form a conductive terminal contact opening 234 to expose the conductive terminal contact 208 and a micro LED opening 232 to expose the top surface 223 of the micro LED 220. At operation 1570 a top contact layer 240 is then formed on the passivation fill layer 230, the micro LEDs 220, and the conductive terminal contacts 208 so that the top contact layer is in electrical contact with the micro LEDs 220 and the conductive terminal contacts 208.

The top contact layer 240 may be formed of a variety of materials, such as transparent conductive oxides (TCOs) or transparent conductive polymers. In an embodiment, top contact layer 240 is formed of indium-tin-oxide (ITO), and may be formed using a suitable technique such as sputtering, and optionally followed by patterning. In an embodiment, a blanket top contact layer 240 is formed over each of the micro LEDs 220 in the array of micro LEDs and each of the conductive terminal contacts 208 in the array of conductive terminal contacts. In such a configuration, the top contact layer 240 provides the conductive terminal structure and signal connection to all of the micro LEDs 220 within the pixel area on the backplane. In an embodiment, a plurality of top contact layers 240 is formed.

Figure 17:
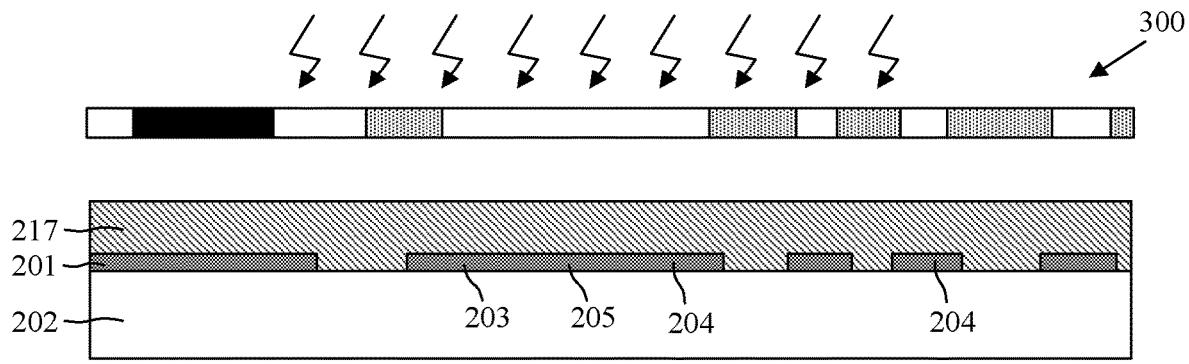
FIGS. 17-20 are schematic cross-sectional side view illustrations of integrating micro devices on a display substrate with a patterned insulating layer covering edges of an array of contact pads in accordance with an embodiment.
Figure 18:
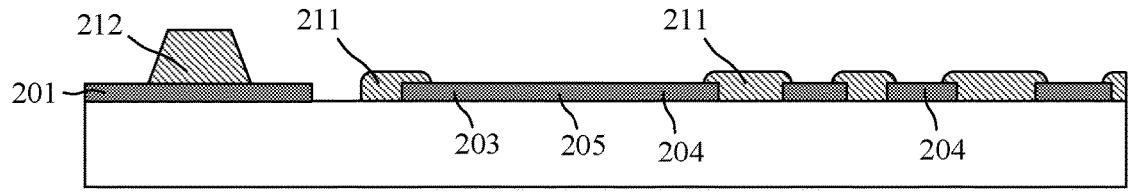

Referring now to FIGS. 17-20 schematic cross-sectional side view illustrations are provided for a method of integrating micro devices on a display substrate with a patterned insulating layer 211 covering edges of an array of contact pads 203, 204 in accordance with an embodiment. In particular, a gray tone photomask 300 may be utilized to form the patterned insulating layer 211 out of the same layer as the bank structure 212. Referring to FIG. 17, an insulating layer 217 is formed over the display substrate 202, including the LED contact pads 203, contact pads 204, and trace lines 205. Insulating layer 217 may be formed out of a photo imagible material such as photoresist. Referring to FIG. 18, the gray tone mask 300 may be used to form a patterned insulating layer 211 covering edges of the ray of contact pads 204, and optionally LED contact pads 203, as well as a patterned bank structure 212. The patterned bank structure 212 may optionally be formed on a conductive terminal line 201.

Figure 19:
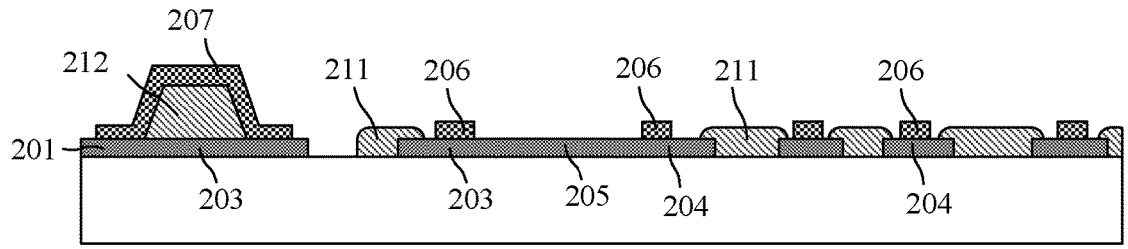
Figure 20:
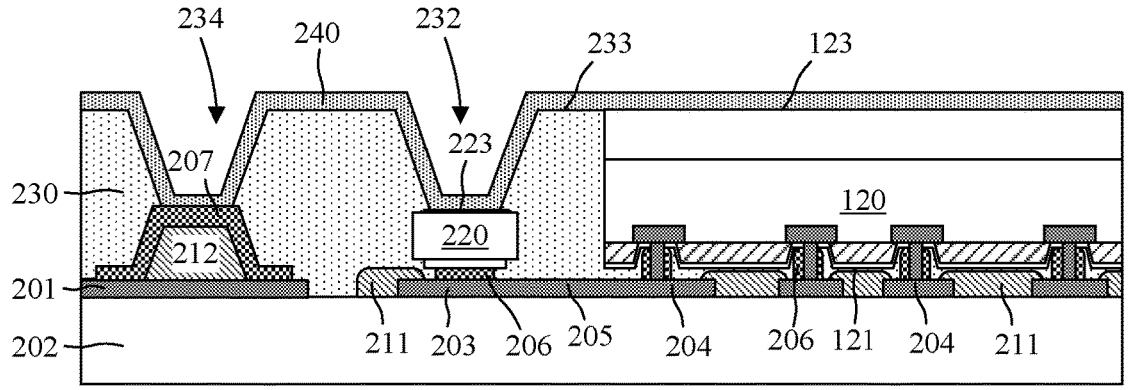

Referring to FIG. 19 the solder material 206 is deposited on the contact pads 204, and LED contact pads 203. Solder contact layer 207 may optionally be deposited over the bank structure 212 and make electrical contact with the conductive terminal line 201. The microdriver chips 120 and micro LEDs 220 may then be transferred and bonded to the display substrate 202 using the solder material 206 as previously described with regard to FIG. 12. Referring to FIG. 20, a passivation fill layer 230 is formed and patterned to form openings 234, 232, and a top contact layer 240 is deposited similarly as described with regard to FIG. 16.

The integration of a patterned insulating layer 211 is not limited to the embodiment illustrated in FIG. 20. For example, a patterned insulating layer 211 may be combined with any of the structures illustrated in FIGS. 16, 22, 24, 25, and 26. In addition to, or alternatively, a solder contact layer 207 may be substituted for the contact layer 208 in FIGS. 16, 22, 24, 25, and 26.

Figure 21:
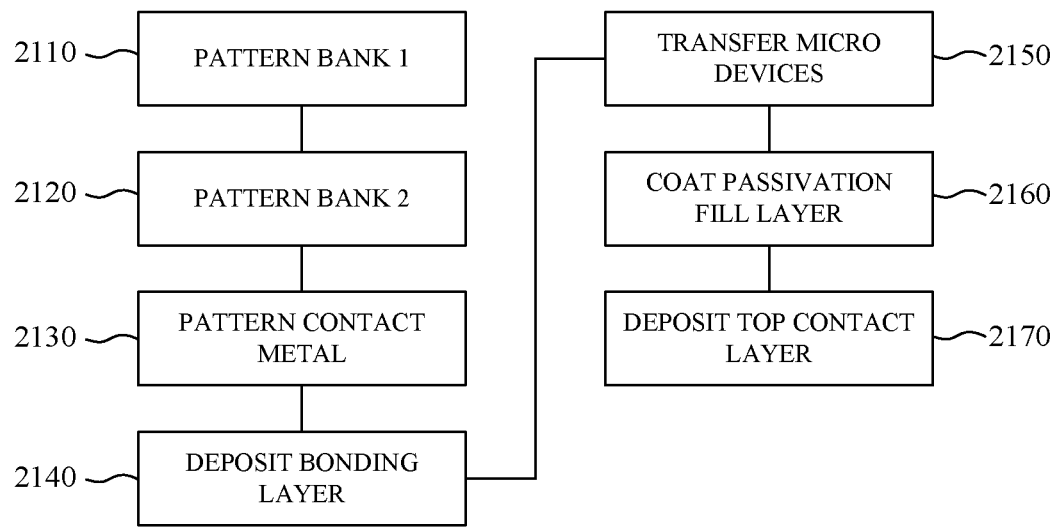
FIG. 21 is a flow chart illustrating a method of integrating micro devices on a display substrate in accordance with an embodiment.
Figure 22:
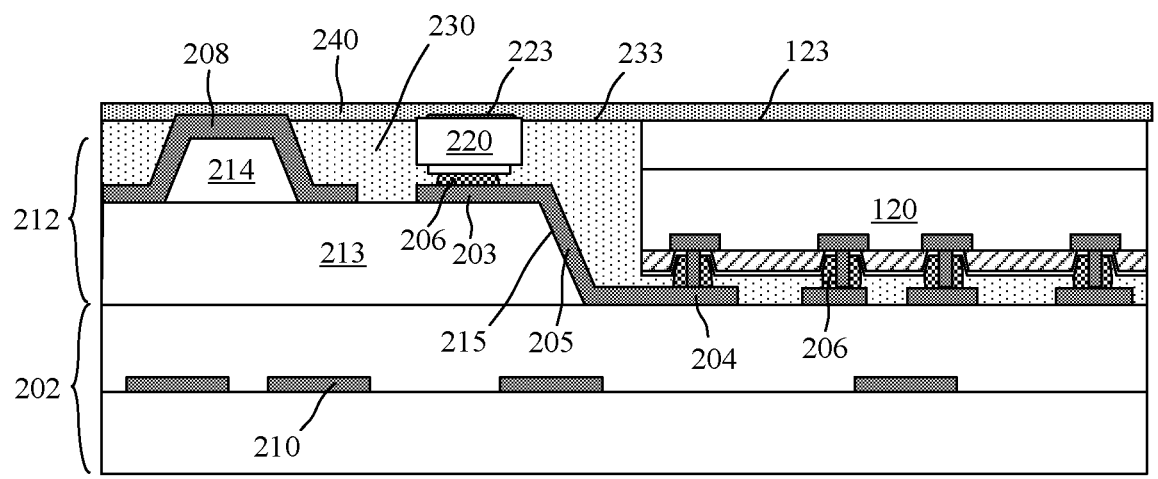
FIG. 22 is a schematic cross-sectional side view illustration of a portion of an integrated display substrate with a raised micro LED in accordance with an embodiment.

Referring now to FIG. 21 a flow chart is provided illustrating a method of integrating micro devices on a display substrate in accordance with an embodiment. FIG. 22 is a schematic cross-sectional side view illustration of a portion of an integrated display substrate 202 with a raised micro LED 220 in accordance with an embodiment. In interest of clarity, FIGS. 21-22 are described concurrently, with reference to the same reference numbers for like features. In addition, FIGS. 21-22 share multiple similarities to FIGS. 15-16. In order to not obscure the present invention, specific differences will be discussed, and similar features and operations may not be discussed in detail.

Referring to FIG. 22, in the embodiment illustrated, the bank structure 212 includes multiple bank levels. Specifically, bank structure 212 includes a first bank level 213 and a second bank level 214 on the first bank level 213. At operation 2110 the first bank level 213 is patterned, followed by pattering the second bank level 214 at operation 2120. In an embodiment, the first and second bank levels 213, 214 are integrally formed of the same material layer. The second bank level 214 may be in the form of lines or discrete, post-like, protrusions.

At operation 2130 contact layers are patterned on the display substrate 202. In an embodiment, one or more metal layers are deposited and patterned to form a plurality of contact pads 204, LED contact pad 203, trace line 205 electrically connecting one of the contact pads 204 to the LED contact pad 203, and conductive terminal contact 208. In the embodiment illustrated in FIG. 22, the LED contact pad 203 is on top of the first bank level 213, and the trace line 205 spans along the sidewalls 215 of the first bank level to a (microdriver chip 120) contact pad 204 on the display substrate 202. As shown, the conductive terminal contact 208 is formed over the second bank level 214. In one embodiment, a top surface of the conductive terminal contact 208 is level with or above a top surface 123 of the microdriver chip 120 (which is not yet bonded to the display substrate at operation 2130).

At operation 2140 the separate locations of the bonding layer (solder material 206) are deposited on the contact pads 204, and micro LED contact pads 203. At operation 2150 the microdriver chips 120 and micro LEDs 220 are transferred and bonded to the contact pads 204, 203 as previously described, followed by coating of the passivation layer 230 at operation 2150, and deposition of the top contact layer 240 at operation 2170.

In the particular embodiment illustrated in FIG. 22 the top surfaces of the conductive terminal contacts 208 and the top surfaces 223 of the micro LEDs 220 may be level with the top surfaces 123 of the microdriver chips 120. In an embodiment, the top surfaces of the conductive terminal contacts 208 and micro LEDs 220 may be within 2 or within 0.5 µm of the top surfaces 123 of the microdriver chips 120. In an embodiment, passivation fill layer 230 is formed using a suitable technique such as slit coating, and includes a level top surface 233 that may optionally be etched back after coating to expose the top surfaces of the conductive terminal contacts 208 and the top surfaces 223 of the micro LEDs 220.

In the embodiment illustrated in FIG. 22 the raised micro LEDs 220 may potentially result in reduced low angle light scattering, and reduced coupling with routing lines 210 buried in the display substrate 202. The raised micro LEDs 220, as well as raised conductive terminal contacts 208 may alleviate the requirement for alignment tolerances when patterning openings in the passivation fill layer 230 to make electrical contact. In other embodiments, a display structure of FIG. 22 may optionally include micro LED openings 232 and/or conductive terminal openings 234. In such a configuration, the bank structure 212 may partially alleviate alignment tolerances due to a reduction in depth of the micro LED openings 232 and/or conductive terminal openings 234.

Figure 23:
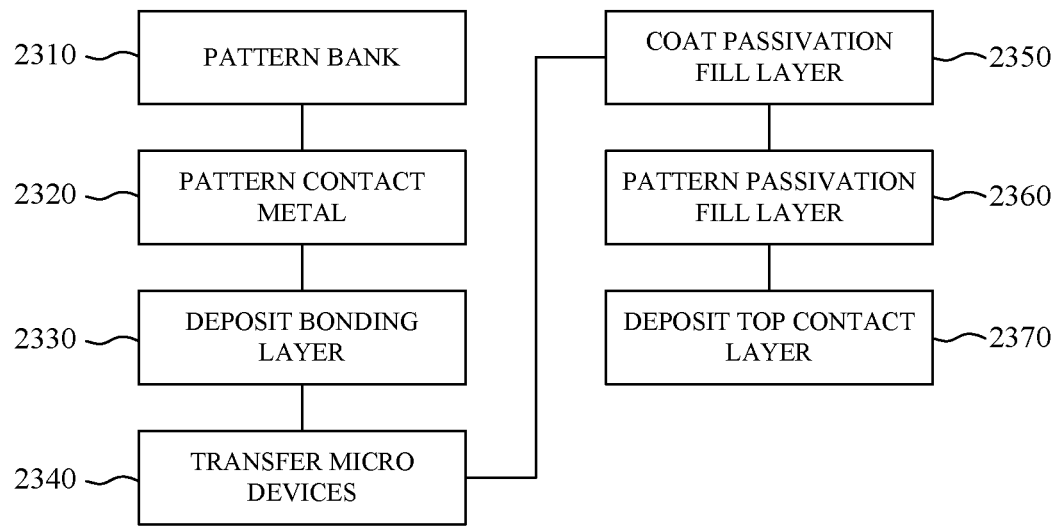
FIG. 23 is a flow chart illustrating a method of integrating micro devices on a display substrate in accordance with an embodiment.
Figure 24:
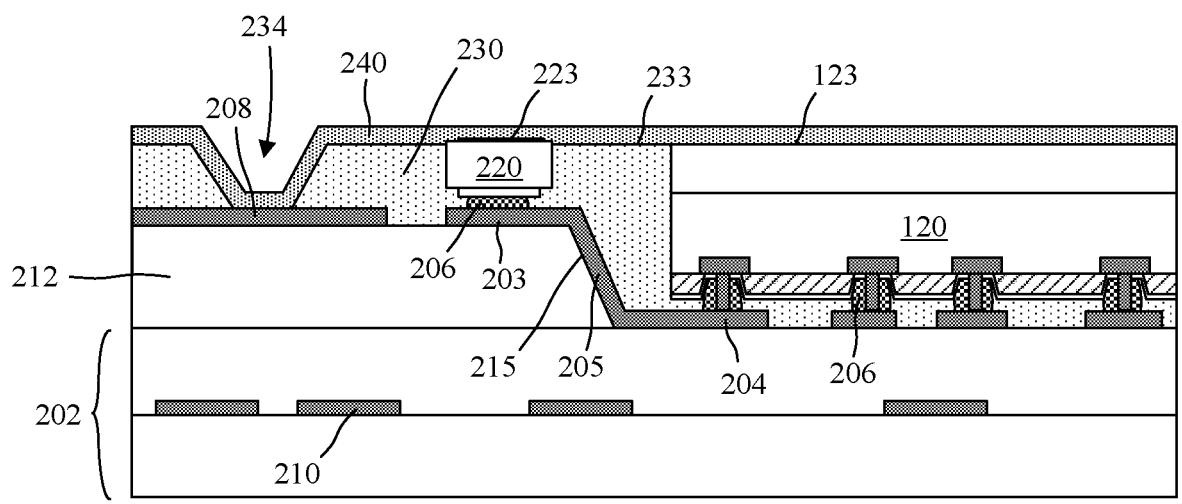
FIG. 24 is a schematic cross-sectional side view illustration of a portion of an integrated display substrate with a raised micro LED and patterned passivation fill layer in accordance with an embodiment.

Referring now to FIG. 23 a flow chart is provided illustrating a method of integrating micro devices on a display substrate in accordance with an embodiment. FIG. 24 is a schematic cross-sectional side view illustration of a portion of an integrated display substrate 202 with a raised micro LED 220 and patterned passivation fill layer 230 in accordance with an embodiment. In interest of clarity, FIGS. 23-24 are described concurrently, with reference to the same reference numbers for like features. In addition, FIGS. 23-24 share multiple similarities to FIGS. 15-16 and FIGS. 21-22. In order to not obscure the present invention, specific differences will be discussed, and similar features and operations may not be discussed in detail.

At operation 2310 the bank structure 212 is patterned on the display substrate 202, followed by patterning the contact layers at operation 2320. Referring to FIG. 24, in the embodiment illustrated, both the conductive terminal contact 208 and the LED contact pad 203 are formed on a top surface of the bank structure 212, for example, a level top surface of the bank structure 212. Additionally, the trace line 205 spans along the sidewalls 215 of the bank structure 212 to a (microdriver chip 120) contact pad 204 on the display substrate 202. Operations 2330-2370 may then be performed similarly as operations 1530-1570, less the formation of a micro LED opening 232.

The integrated structure illustrated in FIG. 24 is similar to that illustrated and described with regard to FIG. 22, with the exception of the conductive terminal contact opening 234 formed in the passivation fill layer 230 and the formation of the conductive terminal contact 208 on top of the bank structure 212 similarly as the micro LED contact pad 203. In the embodiment illustrated in FIG. 24 the raised micro LEDs 220 may potentially result in reduced low angle light scattering, and reduced coupling with routing lines 210 buried in the display substrate 202. The raised micro LEDs 220 may alleviate the requirement for alignment tolerances when patterning openings in the passivation fill layer 230 to make electrical contact. In the embodiment illustrated, conductive terminal contact openings 234 are still formed in the passivation fill layer 230 to provide a path for electrical connection to the conductive terminal contacts 208, however, in some embodiments the alignment tolerances may be greater than for the micro LEDs 220. For example, the risk of shorting along the sidewalls 228 of the micro LEDs 220 is not an issue for making contact with the conductive terminal contacts 208. In addition, contact areas for the conductive terminal contacts 208 and corresponding openings 234 may additionally be made larger than for the micro LEDs 220 in accordance with some embodiments. In other embodiments, a display structure of FIG. 24 may optionally include micro LED openings 232. In such a configuration, the bank structure 212 may partially alleviate alignment tolerances due to a reduction in depth of the micro LED openings 232.

Figure 25:
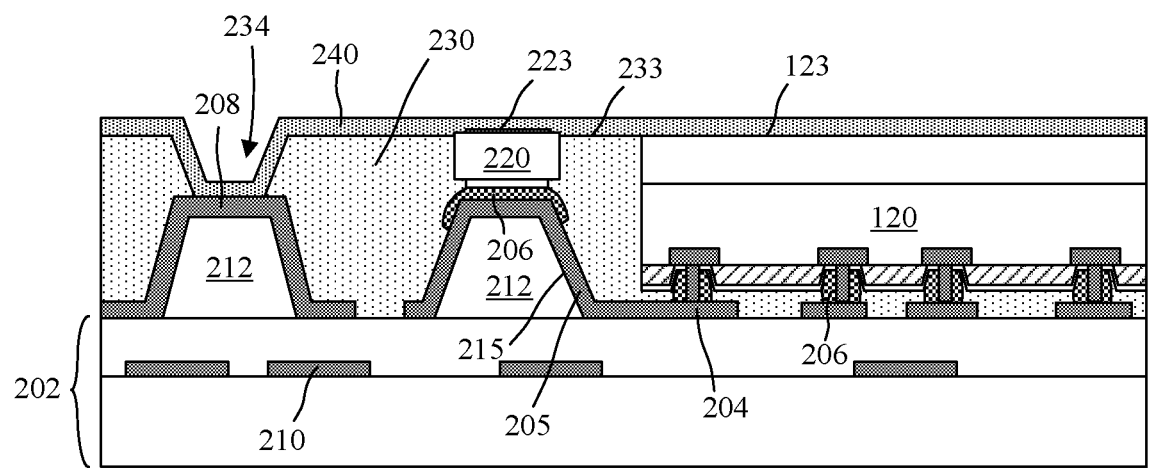
FIG. 25 is a schematic cross-sectional side view illustration of a portion of an integrated display substrate with a raised micro LED and patterned passivation fill layer in accordance with an embodiment.

Referring now to FIG. 25, a schematic cross-sectional side view illustration is provided of a portion of an integrated display substrate 202 with a raised micro LED 220 and patterned passivation fill layer 230 in accordance with an embodiment. FIG. 25 includes several similarities to the embodiment illustrated in FIG. 24 with one difference being the formation of separate bank structures 212 for the conductive terminal contact 208 and micro LED 220. In other embodiments, a display structure of FIG. 25 may optionally include micro LED openings 232. In such a configuration, the bank structure 212 may partially alleviate alignment tolerances due to a reduction in depth of the micro LED openings 232.

Figure 26:
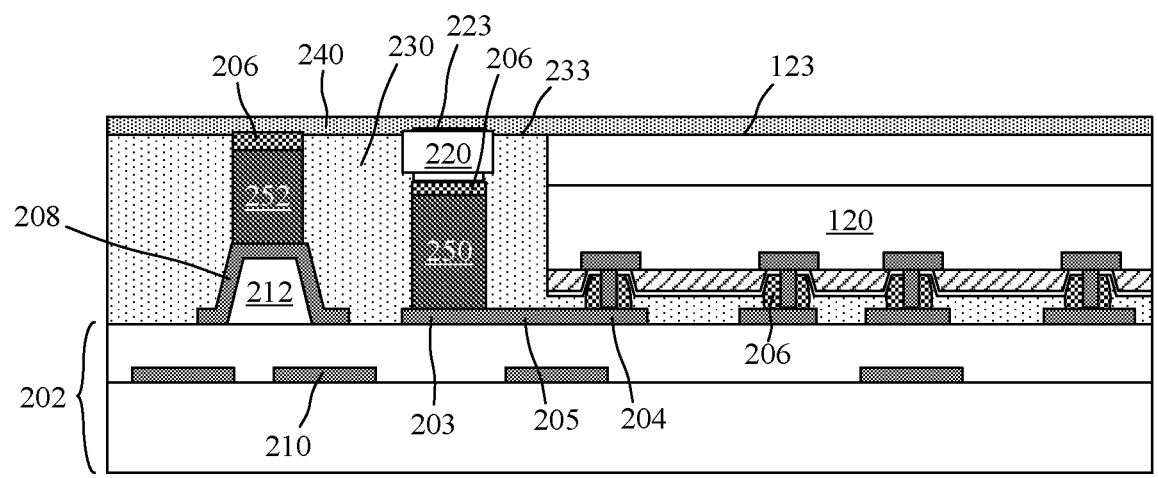
FIG. 26 is a schematic cross-sectional side view illustration of a portion of an integrated display substrate with a raised micro LED and pillar structure in accordance with an embodiment.

FIG. 26 is a schematic cross-sectional side view illustration of a portion of an integrated display substrate 202 with a raised micro LED 220 and pillar structure in accordance with an embodiment. FIG. 25 includes several similarities to the embodiment illustrated in FIG. 22, particularly with the omission of patterned openings in the passivation fill layer 230 for making electrical contact with the conductive terminal contact and the micro LED 220. In such a configuration, the processing may proceed similarly as described with regard to FIG. 16 with the formation of the bank structure 212 and conductive terminal contact 208. Pillar structures 252, 250 may then be formed (e.g. by electroless deposition) on top of the conductive terminal contact 208 on the bank structure 212 and on the micro LED contact pad 203. For example, the pillar structures 252, 250 may be the same height. The pillar structures may include multiple materials. For example, the pillar structures may include a copper, nickel stack followed by the formation of solder material 206 on top of the pillars along with the solder material 206 formed on the contact pads 204. In an embodiment, the microdriver chips 120 and micro LEDs 220 are transferred after the deposition of the solder material 206. In other embodiments, a display structure of FIG. 26 may optionally include micro LED openings 232 and/or conductive terminal openings 234. In such a configuration, the pillar structures 252, 250 may partially alleviate alignment tolerances due to a reduction in depth of the micro LED openings 232 and/or conductive terminal openings 234.

Figure 27A:
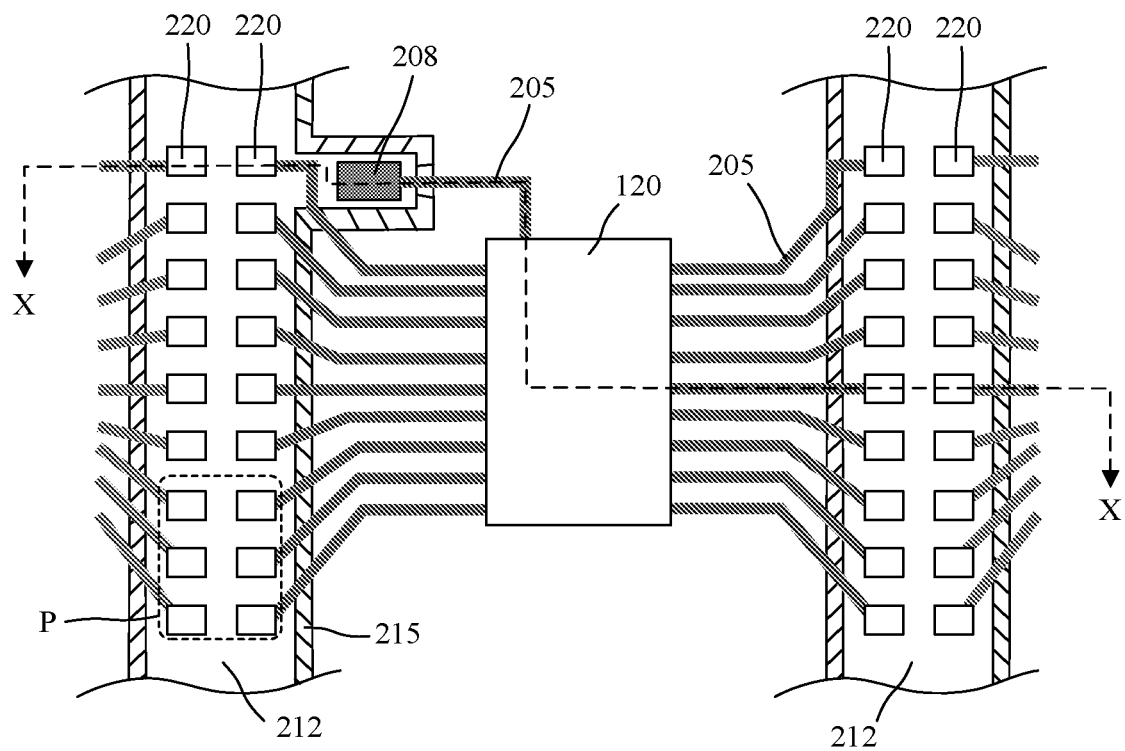
FIG. 27A is a schematic top view illustration of a portion of a display substrate including a microdriver chip and raised micro LEDs in accordance with an embodiment.
Figure 27B:
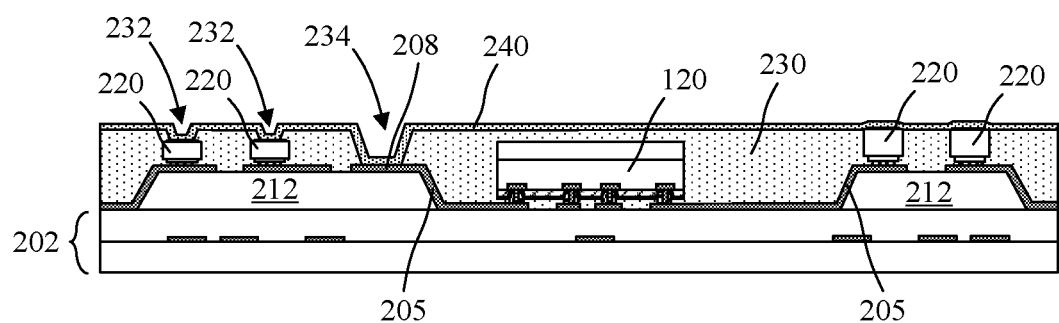
FIG. 27B is a schematic cross-sectional side view illustration taken along line X-X of FIG. 27A in accordance with an embodiment.

Referring now to FIGS. 27A-27B, schematic top view and cross-sectional side view illustrations are provided of a portion of a display substrate including a microdriver chip and raised micro LEDs in accordance with an embodiment. As illustrated, the cross-sectional side view illustration of FIG. 27B is taken along line X-X of FIG. 27A. In the particular embodiment illustrated in FIG. 27A, each microdriver chip 120 is connected to nine micro LEDs 220 on each side, or 3 pixels (P) on each side in an exemplary RGB pixel arrangement, with a plurality of trace lines 205. The number of micro LEDs 220 and pixels (P) illustrated in FIG. 27A is meant to be illustrative and embodiments are not so limited. In the embodiment illustrated, the microdriver chip 120 is optionally coupled to a conductive terminal contact 208. This may the same conductive terminal contact 208 to which the top contact layer 240 is connected to, or alternatively a separate conductive terminal contact 208 reserved for the microdriver chip 120. Though a separate conductive terminal contact 208 may nevertheless receive the same signal as those supplied to the micro LEDs 220, and their corresponding conductive terminal contacts 208.

In an embodiment, one or more microdriver chips 120 are mounted onto the display substrate 202 within an opening in a bank structure 212, or laterally between bank structures 212. In the particular embodiment illustrated in FIG. 27A, the bank structures 212 are in the shape of rails extending across the display substrate (e.g. vertically or horizontally), with the microdriver chips 120 mounted between adjacent bank structures 212. Conductive terminal contact 208 may optionally be formed on the bank structure 212. For example, conductive terminal contact 208 may be formed on a protrusion of the bank structure 212 rail.

In the particular embodiment illustrated in FIGS. 27A-27B, redundant micro LED 220 pairs are mounted onto the bank structures 212. For example, each microdriver chip 120 may be connected to a row/column of micro LEDs 220 on each adjacent bank structure 212. A variety of operating configurations can be used for redundancy. In an exemplary embodiment, a set of micro LEDs 220 one bank structure 212 (e.g. left side) may be primary operating micro LEDs 220, while a set of micro LEDs 220 on the other bank structure 212 (e.g. right side) may be redundant, or secondary micro LEDs 220 that do not operate unless a set of conditions are met. Though, all of the micro LEDs 220 may also be operated.

Referring specifically to FIG. 27B, micro LED openings 232 are illustrated over the micro LED 220 pairs on the left side, while micro LED openings 232 are not illustrated over the micro LED 220 pairs on the right side. This anomaly may be explained by the micro LEDs 220 having a different thickness, or more specifically micro LEDs 220 designed for different color emission (e.g. red, green, and blue) having different thicknesses. Thus, in accordance with embodiments, micro LEDs 220 designed for different color emissions may have corresponding different depths of micro LED openings 232. In an embodiment, micro LED openings 232 are formed over all micro LEDs 220. In an embodiment, micro LED openings 232 are formed over only some micro LEDs 220.

In accordance with embodiments, the physical layouts and configurations illustrated with regard to FIG. 27A-27B are not specifically limited, and may be applied to other physical layouts described herein including, but not limited to, FIG. 16, FIG. 20, FIG. 22, FIG. 24, FIG. 25, and FIG. 26.

In utilizing the various aspects of the embodiments, it would become apparent to one skilled in the art that combinations or variations of the above embodiments are possible for integrating and electrically connecting micro LEDs and microdriver chips on a display substrate. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:
1. A chip comprising:
a device layer;
a build-up layer below the device layer, the build-up layer including a plurality of landing pads;
a passivation layer below the build-up layer, the passivation layer including a bottom surface;
a plurality of trenches formed completely through the passivation layer to expose the plurality of landing pads;
a barrier layer spanning the bottom surface of the passivation layer, sidewalls of the plurality of trenches and the plurality of landing pads, wherein the barrier layer is thinner than the passivation layer and has a topography that is conformal to a topography of the bottom surface of the passivation layer, the sidewalls of the plurality of trenches and the plurality of landing pads;
a plurality of stud openings in the barrier layer within the plurality of trenches, and a corresponding plurality of conductive studs extending from the plurality of landing pads and through the plurality of stud openings in the barrier layer within the plurality of trenches;
wherein each conductive stud completely fills a corresponding stud opening in the barrier layer and is surrounded by sidewalls of the barrier layer within a corresponding trench such that a reservoir is formed between the conductive stud and the sidewalls of the barrier layer within the corresponding trench; and
each conductive stud includes a bottom surface that is below the bottom surface of the passivation layer.

2. The chip of claim 1, wherein the barrier layer provides a non-wetting surface for solder reflow.

3. The chip of claim 2, wherein the barrier layer is less than 2,000 Angstroms thick.

4. The chip of claim 3, wherein the barrier layer comprises aluminum oxide ($Al_2O_3$).

5. A display comprising:
a display substrate including an array of contact pads;
an array of light emitting diodes (LEDs) bonded to the display substrate;
an array of chips bonded to the display substrate;

wherein each chip is electrically connected to one or more LEDs to drive the one or more LEDs;
wherein each chip includes:
a device layer;
a build-up layer below the device layer, the build-up layer including a plurality of landing pads;
a passivation layer below the build-up layer, the passivation layer including a bottom surface;
a plurality of trenches formed completely through the passivation layer to expose the plurality of landing pads;
a barrier layer spanning the bottom surface of the passivation layer, sidewalls of the plurality of trenches and the plurality of landing pads, wherein the barrier layer is thinner than the passivation layer has a topography that is conformal to a topography of the bottom surface of the passivation layer, the sidewalls of the plurality of trenches and the plurality of landing pads;
a plurality of stud openings in the barrier layer within the plurality of trenches, and a corresponding plurality of conductive studs extending from the plurality of landing pads and through the plurality of stud openings in the barrier layer within the plurality of trenches;
wherein each conductive stud completely fills a corresponding stud opening in the barrier layer and is surrounded by sidewalls of the barrier layer within a corresponding trench such that a reservoir is formed between the conductive stud and the sidewalls of the barrier layer within the corresponding trench; and
each conductive stud includes a bottom surface that is below the bottom surface of the passivation layer;
wherein each conductive stud is bonded to a contact pad with a solder material that is reflowed into the reservoir of a corresponding trench.

6. The display of claim 5, further comprising:
an array of conductive terminal lines on the display substrate;
a top contact layer on and in electrical connection with the array of LEDs, and on and in electrical connection with the array of conductive terminal lines.

7. The display of claim 5, further comprising:
an array of conductive terminal posts on the display substrate;
a top contact layer on and in electrical connection with the array of LEDs, and on and in electrical connection with the array of conductive terminal posts.

8. The display of claim 5, further comprising:
a patterned insulating layer covering edges of the array of contact pads;
wherein each chip is bonded to a plurality of contact pads directly over a corresponding portion of the patterned insulating layer.

9. A display comprising:
a display substrate;
a plurality of contact pads on the display substrate;
a chip bonded to the plurality of contact pads;
a bank structure laterally adjacent to the chip;
a trace line electrically connecting one of the plurality of contact pads to an LED contact pad on top of the bank structure, wherein the LED contact pad is raised above the plurality of contact pads on the display substrate;
an LED bonded to the LED contact pad.

10. The display of claim 9, wherein the trace line runs along a sidewall of the bank structure.

11. The display of claim 9, further comprising:
a passivation fill layer around sidewalls of the LED and the chip; and
a top contact layer spanning over the passivation fill layer, the LED, and the chip, wherein the top contact layer is on and in electrical contact with the LED and a conductive terminal contact.

12. The display of claim 11, wherein the bank structure comprises a first bank level, and a second bank level on the first bank level, and the conductive terminal contact is on the second bank level.

13. The display of claim 12, wherein the second bank level is integrally formed with the first bank level.

14. The display of claim 11, further comprising:
an opening in the passivation fill layer over the conductive terminal contact;
wherein the conductive terminal contact is on the bank structure, and the top contact layer spans along sidewalls of the opening in the passivation fill layer.

15. The display of claim 11, further comprising:
a second bank structure laterally adjacent to the bank structure;
an opening in the passivation fill layer over the conductive terminal contact;
wherein the conductive terminal contact is on the second bank structure, and the top contact layer spans along sidewalls of the opening in the passivation fill layer.

16. The display of claim 11, further comprising:
a patterned insulating layer covering edges of the plurality of contact pads;
wherein the chip is bonded to the plurality of contact pads directly over a portion of the patterned insulating layer.

17. The display of claim 11, wherein the passivation fill layer includes a top surface and a conformal bottom surface.

18. The display of claim 17, wherein the conformal bottom surface is conformal to a topography of a conductive terminal contact on the bank structure, and the trace line electrically connecting one of the plurality of contact pads to the LED contact pad.

19. The display of claim 11, wherein the chip comprises:
a device layer;
a passivation layer below the device layer, the passivation layer including a bottom surface;
a plurality of trenches in the passivation layer;
a plurality of conductive studs within the plurality of trenches;
a plurality of conductive studs within the plurality of trenches and extended below a bottom surface of the passivation layer;
wherein each conductive stud is bonded to a contact pad with a solder material that is reflowed into a corresponding trench.

20. The display of claim 9, wherein a top surface of the LED is within at least 2 μm of a top surface of the adjacent chip, and the bank structure is formed of an electrically insulating material.

* * * * *